(12) United States Patent
Kajimoto

(10) Patent No.: US 6,315,575 B1
(45) Date of Patent: Nov. 13, 2001

(54) INTERCONNECTOR ELECTRICALLY CONNECTING PLURALITY OF ELECTRONIC DEVICE ELEMENTS, FABRICATION METHOD THEREOF, AND JOIN APPARATUS THEREOF

(75) Inventor: Kimihiko Kajimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/521,428

(22) Filed: Mar. 8, 2000

(30) Foreign Application Priority Data

Mar. 10, 1999 (JP) ................................................. 11-063059
Feb. 8, 2000 (JP) ................................................. 12-030065

(51) Int. Cl.$^7$ ................................................. H01R 41/00
(52) U.S. Cl. .............................................. 439/33; 136/256
(58) Field of Search ................. 439/33, 67; 174/117 FF, 174/261; 228/185; 361/809; 136/256

(56) References Cited

U.S. PATENT DOCUMENTS

| 3,330,700 | 7/1967 | Golub et al. . |
| 3,993,505 | 11/1976 | Pack, Sr. . |
| 4,652,693 | 3/1987 | Bar-On . |
| 4,940,496 | * 7/1990 | Matsumoto et al. ................. 136/256 |
| 5,430,616 | * 7/1995 | Katsu et al. ........................... 361/809 |
| 5,821,609 | * 10/1998 | DiStefano et al. .................... 257/669 |

FOREIGN PATENT DOCUMENTS

| 62-16579 | 1/1987 | (JP) . |
| 1-125563 | 8/1989 | (JP) . |
| 4-298082 | 10/1992 | (JP) . |

* cited by examiner

Primary Examiner—Brian Sircus
Assistant Examiner—Brian S. Webb
(74) Attorney, Agent, or Firm—Nixon & Vanderhye P.C.

(57) ABSTRACT

An interconnector includes a front surface electrode connecting portion connected to a front surface electrode of a solar cell, a back electrode connecting portion connected to a back electrode of another solar cell adjacent to the solar cell, and a stress relief portion absorbing displacement generated between the front surface electrode connecting portion and the back electrode connecting portion. A plurality of notches are formed at the front surface electrode connecting portion and the back electrode connecting portion. Since the front surface electrode connecting portion and the back electrode connecting portion have notches, an area sufficient for welding can be ensured. Reliability at the joining portion of the interconnector can be improved. Also, the interconnector can be reduced in size to allow reduction in cost.

30 Claims, 9 Drawing Sheets

FIG. 1A  PRIOR ART
FIG. 1B  PRIOR ART
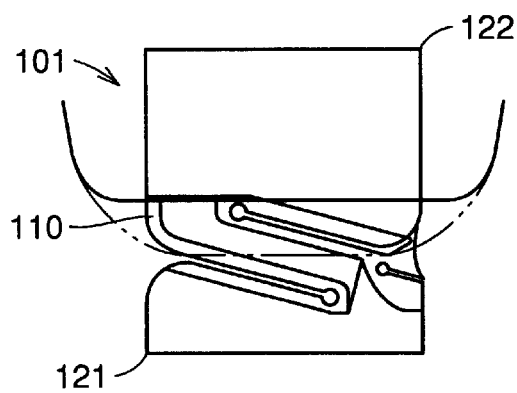
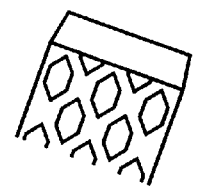

| CELL No. | TENSILE STRENGTH (g) | RUPTURE MODE |
|---|---|---|
| 1 | 1020 | INTERCONNECTOR SEVERED |
| 2 | 985 | INTERCONNECTOR SEVERED |
| 3 | 1250 | INTERCONNECTOR SEVERED |
| AVERAGE | 1085 | — |

INTERCONNECTOR ELECTRICALLY CONNECTING PLURALITY OF ELECTRONIC DEVICE ELEMENTS, FABRICATION METHOD THEREOF, AND JOIN APPARATUS THEREOF

BACKGROUND OF THE INVENTION

1. Field of the Invention

The present invention relates to an interconnector to electrically connect a plurality of electronic device elements in a serial direction or a parallel direction. Particularly, the present invention relates to a planar type interconnector employed in the connection of solar cells for artificial satellites or diodes, a method of forming such an interconnector, and a join apparatus thereof.

2. Description of the Background Art

The current consumed energy worldwide corresponds to an enormous amount, which is mainly supplied by fossil fuel such as oil or the like. It is expected that the fossil fuel will be exhausted in the near future if the energy consumption increases at the current rate.

In these few years, intensive research of the technology utilizing inexhaustible and clean solar energy has been in progress as the energy source to replace the fossil fuel. Development of solar cells can be referred to as one major technique thereof. In general, the plurality of solar cells constituting the solar battery are arranged adjacent to each other. An interconnector formed of a small piece of metal is provided in order to electrically connect the solar cells in the serial or parallel direction.

An interconnector includes a stress relief portion that absorbs displacement generated between solar cells connected to each other, and at least two connecting portions connected to the solar cells. The invention disclosed in Japanese Patent Laying-Open No. 4-298082 and the invention disclosed in Japanese Utility Model Laying-Open No. 1-125563 can be enumerated as conventional art related to such an interconnector.

FIG. 1A schematically shows a structure of an interconnector disclosed in Japanese Patent Laying-Open No. 4-298082. This interconnector 101 includes a front surface electrode connecting portion 121, a back electrode connecting portion 122, and a stress relief portion 110. As shown in FIG. 1B, front surface electrode connecting portion 121 and back electrode connecting portion 122 have a mesh structure.

The interconnector disclosed in Japanese Utility Model Laying-Open No. 1-125563 includes a first stress absorption portion having a plurality of permeable holes arranged in the row direction with respect to the interconnector, and a second stress absorption portion having a plurality of permeable holes arranged in the column direction.

In order to withstand the displacement generated between adjacent solar cells, an area for connecting or welding sufficient for the connecting portion is required in joining the connecting portion of the interconnector with the electrode portion of the solar cell. In the inventions disclosed in the aforementioned Japanese Patent Laying-Open No. 4-298082 and Japanese Utility Model Laying-Open No. 1-125563, a mesh opening or permeable hole is provided at the connecting portion of the interconnector. Connection with the electrode portion of the solar cell was effected using the opening or permeable hole. In order to ensure a connection area sufficient for the connecting portion of the interconnector, the area of the connecting portion of the interconnector will become larger. In solar cells for artificial satellites, there is a problem that increase in the area of the connecting portion will raise the cost since noble metal such as gold, silver or the like is generally used as the material of the interconnector. Increase in the area of the connecting portion of the interconnector will also reduce the light-receiving area of the solar cell. As a result, there is a problem that the efficiency and output of the solar cell will be degraded.

The provision of a mesh opening or permeable hole at the connecting portion of the interconnector will become the cause of crushing the mesh opening or permeable hole when welding is effected using a weld electrode of a large width. When pressure is applied with the weld electrode in contact with the residual portion of the mesh opening or permeable hole, i.e. the remaining metal portion for welding, stress concentration occurs at that portion to become the cause of damaging the solar cell. For the reliability of the weld portion, welding was effected on one connecting portion between the interconnector and the solar cell using a small weld electrode of a small width. If the area of the connecting portion of the connector is increased, welding must be effected many times on one connecting portion when a small weld electrode is used. A tremendous amount of time will be required for welding to degrade the productivity.

There was also problem that the process of etching is required to form the mesh opening or permeable hole at the connecting portion of the interconnector, resulting in increase of the processing cost. In the case where etching is applied on the connecting portion of the interconnector, automation cannot be facilitated since it is extremely difficult to work on components of a continuous form. Even if a continuous interconnector is formed by working on a continuous form, there was a problem that the cost of the interconnector is increased.

In the case where a continuous interconnector cannot be formed, each produced interconnector must be accommodated in a pallet or the like individually. Extra space to install the pallet is required. There is also the possibility that the produced interconnector may be lost if small in size.

SUMMARY OF THE INVENTION

An object of the present invention is to provide an interconnector reduced in size and cost, and that has high productivity.

Another object of the present invention is to provide an interconnector that facilitates the connecting task with a solar cell, and that can prevent reduction in the efficiency and output of the solar cell.

A further object of the present invention is to provide a method of forming an interconnector that allows automated connection between an interconnector and a solar cell.

Still another object of the present invention is to provide a join apparatus that allows automatic connection between an interconnector and a solar cell.

According to an aspect of the present invention, an interconnector includes a first connecting portion connected to an electrode of a first electronic device element, a second connecting portion connected to an electrode of a second electronic device element adjacent to the first electronic device element, and a stress relief portion absorbing displacement generated between the first and second electronic device elements. At least one of the first and second connecting portions includes one or more notches.

Since at least one of the first and second connecting portions includes at least one notch, sufficient weld area can be provided to allow increase of the reliability at the connecting portion of the interconnector. Also, the connector can be reduced in size to lower the cost.

According to another aspect of the present invention, a method of forming an interconnector that connects a first electronic device element with a second electronic device element adjacent to the first electronic device element is provided. The method includes the steps of forming a plurality of interconnectors by press-working on a continuous sheet-like material, and accommodating the continuous sheet-like material where the plurality of interconnectors are formed in a reel.

Since the continuous sheet-like material is subjected to press-working to form a plurality of interconnectors and accommodated in a reel, supply of the interconnector can be automated to allow automatic connection between an interconnector and a solar cell.

According to a further aspect of the present invention, a join apparatus include a sever unit to cut off an interconnector formed at a continuous sheet-like material, a first convey unit to convey the interconnector cut off by the sever unit, a second convey unit to convey an electronic device element, and a join unit to join the interconnector conveyed by the first convey unit with the electronic device element conveyed by the second convey unit.

Since the join unit joins a connector and a solar cell after the sever unit cuts off the interconnector formed on a continuous sheet-like material, the join between an interconnector and a solar cell can be carried out automatically.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are diagrams to describe a conventional interconnector.

DESCRIPTION OF THE PREFERRED EMBODIMENTS

First Embodiment

Figure 2:
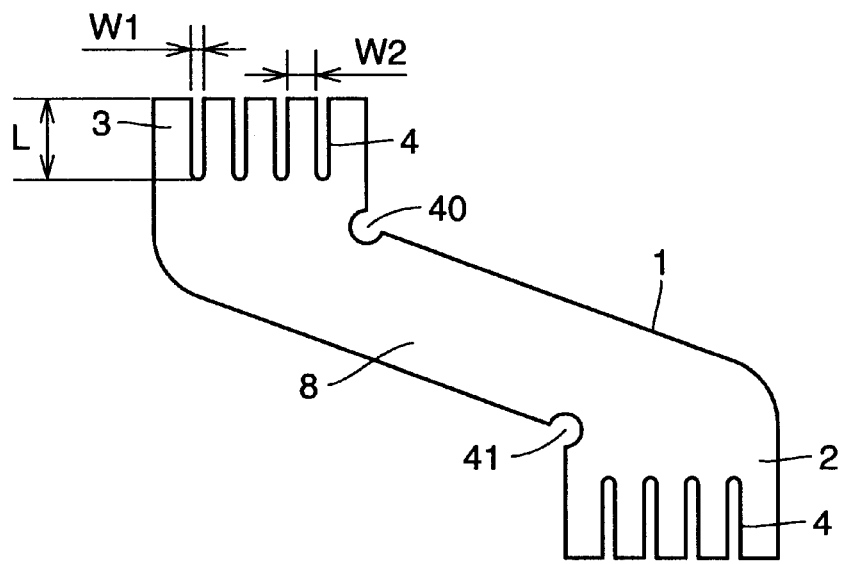
FIG. 2 shows an appearance of an interconnector according to a first embodiment of the present invention.

Referring to FIG. 2, an interconnector 1 includes a front surface electrode connecting portion 2 connected to a front surface electrode of a solar cell not shown, a back electrode connecting portion 3 connected to a back electrode of another solar cell adjacent in a serial direction with respect to that solar cell, and a stress relief portion 8 between front surface electrode connecting portion 2 and back electrode connecting portion 3.

Stress relief portion 8 absorbs and alleviates the displacement generated between front electrode connection portion 2 and back electrode connecting portion 3 by being bent at the region of round notches 40 and 41. At least one notch 4 extending from the opening of interconnector 1 is provided at front surface electrode connecting portion 2 and back electrode connecting portion 3. Notch 4 is formed so that the ratio of w1 to w2 (w1÷w2) is not more than 1, where w1 is the width of notch 4 and w2 is the width of the joining portion excluding notch 4 (the width between notches 4, or the width from notch 4 to the edge of the joining portion).

Figure 3:
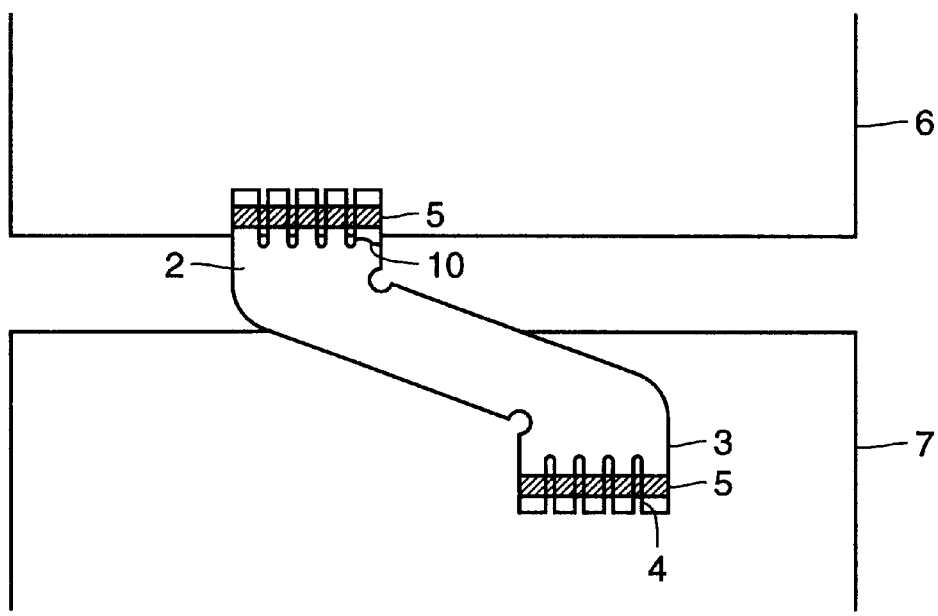
FIG. 3 shows the case where an interconnector 1 is connected to a solar cell.

FIG. 3 shows the case where interconnector 1 of FIG. 2 is connected to a solar cell. Front surface electrode connecting portion 2 of interconnector 1 is connected to the front surface electrode connecting portion of solar cell 6 by welding or the like. Back surface electrode connecting portion 3 of interconnector 1 is connected to the back electrode connecting portion of solar cell 7 adjacent to solar cell 6 in the serial direction by welding or the like. Since width w1 of notch 4 formed at front surface electrode connecting portion 2 and back electrode connecting portion 3 is smaller than width w2 of the joining portion excluding notch 4, decrease in the weld area by notch 4 is small. A weld area large enough can be obtained. Thus, sufficient mechanical join strength between interconnector 1 and solar cell 6 or 7 can be obtained.

The influence of the residual stress during welding can be dispersed since the connecting portion is divided by notches 4. In the case where the solar cell is greatly displaced due to the effect of the thermal stress or external force during production to result in generation of a crack 10 at the connecting portion (for example, at front surface electrode connecting portion 2) of interconnector 1, further development of the crack can be suppressed by notch 4. Therefore, degradation of the reliability of weld portion 5 of interconnector 1 can be prevented.

Figure 4A:
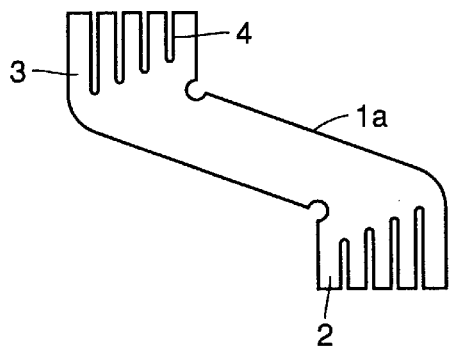
FIGS. 4A–4E show other examples of an appearance of interconnector 1.
Figure 4C:
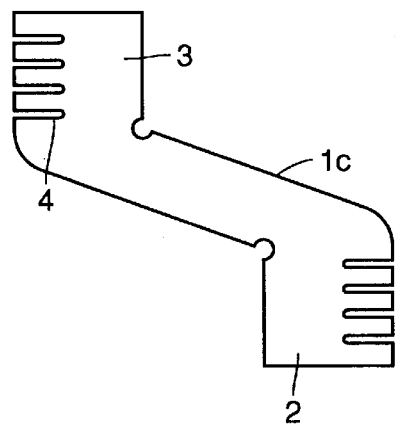
Figure 4B:
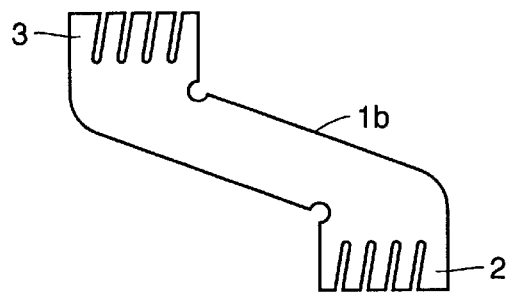
Figure 4D:
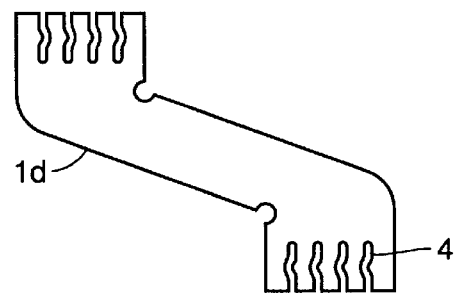
Figure 4E:
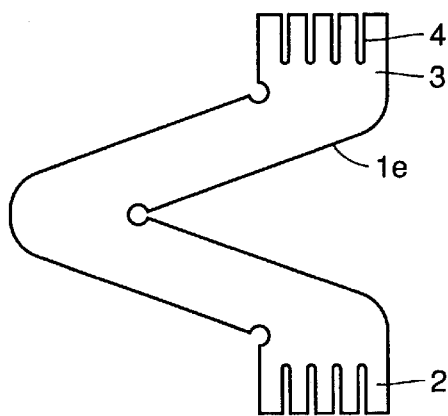

Interconnector 1 of the present embodiment is not limited to the configuration shown in FIG. 2. A configuration shown in FIGS. 4A–4E, for example, may be employed. An interconnector 1a of FIG. 4A has the depth of the notch in front surface electrode connecting portion 2 and back electrode connecting portion 3 gradually increased. An interconnector 1b of FIG. 4B has the notch of front surface electrode connecting portion 2 and back electrode connecting portion 3 formed oblique with respect to the connecting portion. An interconnector 1c of FIG. 4C has the notch formed in the lateral direction of front surface electrode connecting portion 2 and back electrode connecting portion 3. An interconnector 1d shown in FIG. 4D has notches formed in a zigzag manner at front surface electrode connecting portion 2 and back electrode connecting portion 3. An interconnector 1e of FIG. 4E has the number of stress relief portions between front surface electrode connecting portion 2 and back electrode connecting portion 3 increased.

According to the interconnector of the present embodiment, the weld area is not reduced by notch 4 and of a sufficient area can be obtained to allow reduction in the size and cost of an interconnector. Also, the influence of the residual stress during welding can be dispersed since the connecting portion is divided by notches 4. Therefore, reliability at the connecting portion can be improved.

Second Embodiment

Figure 5:
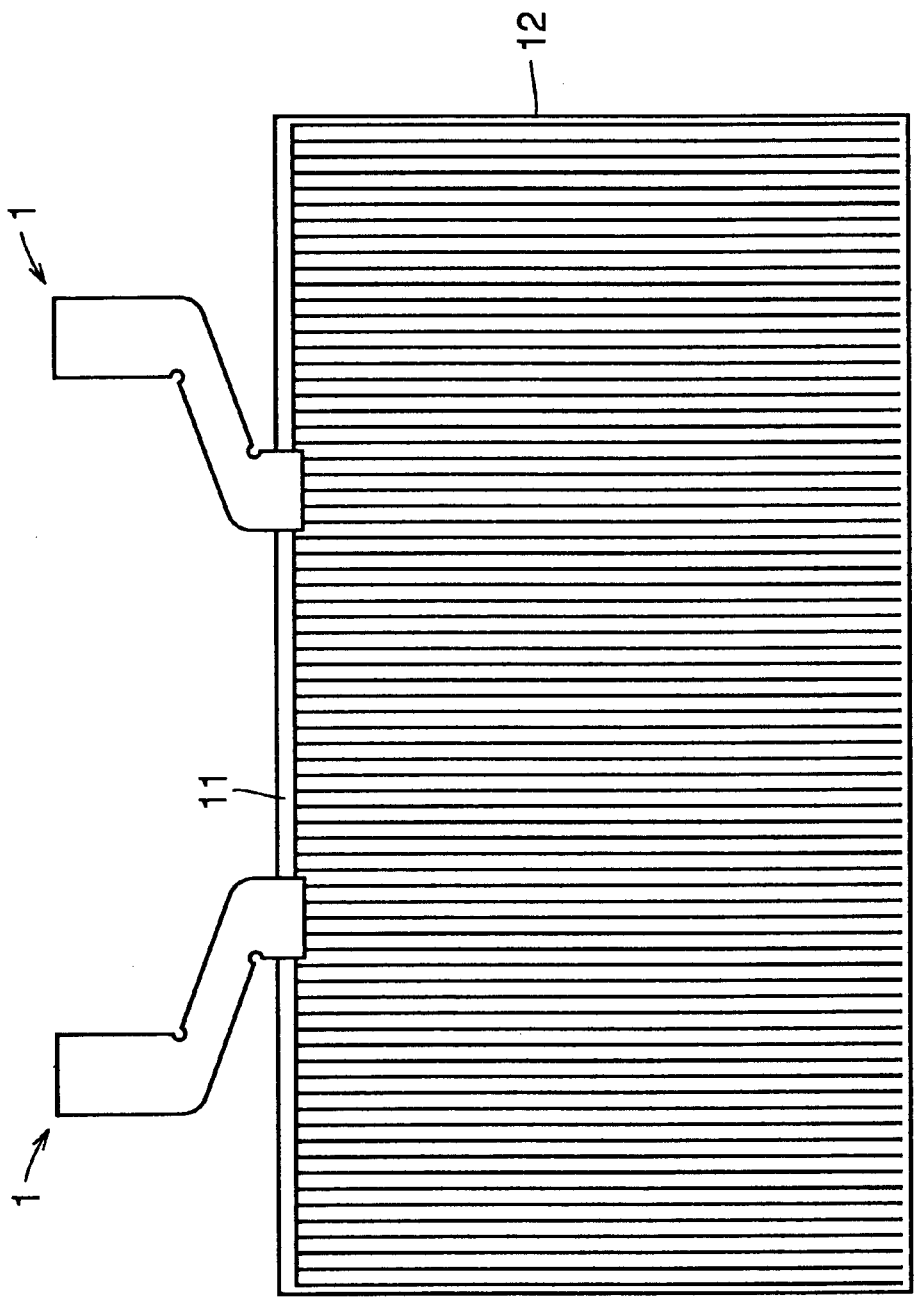
FIG. 5 shows the case where an interconnector of a second embodiment is connected to a solar cell.

FIG. 5 shows the case where an interconnector of the present embodiment is connected to a solar cell. The configuration of the interconnector of the present embodiment is identical to that of the interconnector shown in FIG. 2 or 4. Therefore, detailed description thereof will not be repeated.

In a solar cell 12, a rod-like front surface electrode 11 is elongated laterally. Therefore, a join area of a certain level can be ensured even if the distance of the connecting portion of solar cell 12 in the vertical direction is reduced. It is therefore possible to reduce the element of decreasing the light-receiving area of solar cell 12. Thus, the efficiency and output of solar cell 12 can be further improved.

Third Embodiment

The configuration of an interconnector according to a third embodiment of the present invention is identical to that of the interconnector shown in FIG. 2. The connection between the interconnector of the present embodiment and a solar cell is similar to that of FIG. 3 or 5. Therefore, detailed description of the same structure or function will not be repeated.

In the joining operation of interconnector 1 with a solar cell 12 by welding, a plurality of interconnectors 1 are joined to solar cell 12 to connect adjacent solar cells. The welding is generally carried out by a pair of weld electrodes arranged in parallel. However, when a mesh opening or permeable hole is provided at the connecting portion of the interconnector as described in the conventional art, the weld electrode must be pressed against the joining portion of the interconnector with a great force if the width of the weld electrode is increased. This may cause stress concentration at the metal-remaining portion for welding to damage the solar cell. Conventionally, welding was carried out using one pair of small weld electrodes urged a plurality of times.

Figures 6, 7:
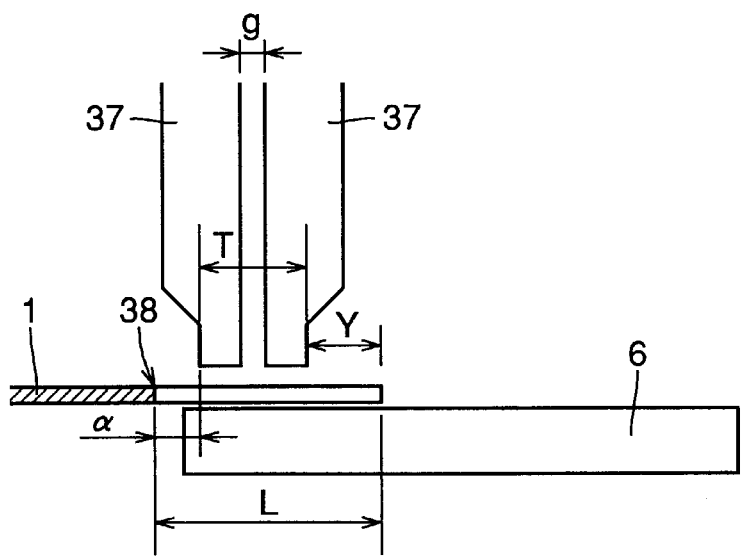
FIG. 6 is a table showing the measured values of strength when interconnector 1 is welded to a solar cell.
FIG. 7 is a diagram to describe the relationship between the length of a notch 4 and the width of a weld electrode 37.

Interconnector 1 of the present embodiment can have the area of the connecting portion increased. Even if welding is carried out using a weld electrode of a large width, the stress concentration at the connecting portion of interconnector 1 is small. Therefore, solar cell 12 will not be damaged FIG. 6 is a table of the strength measured when interconnectors 1 of the present embodiment are welded at one time with a weld electrode of a large width. The solar cell was of a cell type BSR (Back Surface Reflector) with a thickness of 0.15 mm. The pad size of the weld portion was 1.5×2.5 mm². The ratio of width w1 of notch 4 of the connecting portion to width w2 of the joining portion excluding notch 4 was 1.0. Silver system material was employed for interconnector 1. Four notches were provided with w1=0.25 mm, w2=0.25 mm and a slit length of L=0.9 mm. The values in the table show the result of such a solar cell connected with interconnectors 1 by one-time welding, and subjected to a 45° tensile test. A weld electrode of 0.3×2.7 mm² was used.

The tensile test was carried out on three solar cells of cell numbers 1–3. It is appreciated from the table of FIG. 6 that the smallest value of the tensile strength was 985 g. The conventional standard of the tensile strength of a solar cell is at least 500 g. Therefore, this condition is satisfied sufficiently.

FIG. 7 is a diagram to describe the dimension of the weld electrode. In welding interconnector 1 to solar cell 6, a pair of weld electrodes 37 is used. A gap g of approximately 0.1–0.3 mm is provided for the pair of weld electrodes 37. When gap g is 0.1 mm, the total width T of the pair of weld electrodes 37 is 0.7 mm. The length from the edge of interconnector 1 to weld electrode 37 is the positioning dimension Y.

Figure 8A:
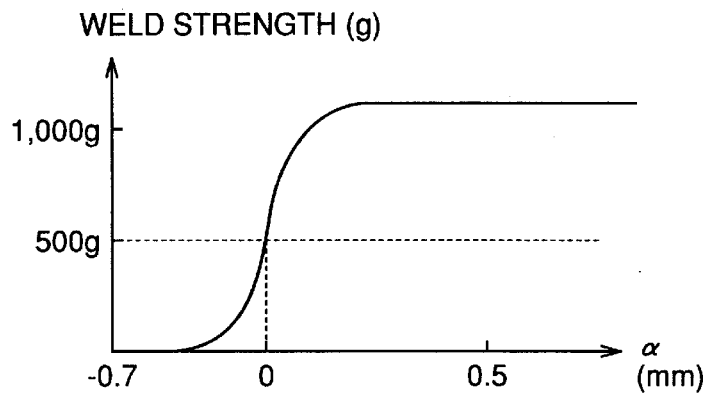
FIGS. 8A–8C show the relationship between each size of interconnector 1 and the weld strength.

When interconnector 1 is to be welded with solar cell 6, the slit length L of interconnector 1 is represented by L=T+α+Y, where α is the length from the end of weld electrode 37 to an end 38 of notch 4. When Y takes a constant value, the dimension of slit depth L is defined by the value of α. FIG. 8A shows the relationship between value α and the weld strength as a result of the measurement of the weld strength after welded interconnector 1 is subjected to a thermal shock test. Y is set to 0.3 mm, and the cycle of −196° C.~130° C. was carried out 1,000 times for the thermal shock test. It is appreciated from FIG. 8A that a weld strength of at least 500 g is obtained by at least α=0 mm. A thermal shock test was carried out while altering dimension Y in the range of −0.3~3 mm. The welded strength after the test was identical to that of Y=0.3 mm. Therefore, slit length L of notch 4 is to be at least (width T of the weld electrode+positioning dimension Y).

Figure 8B:
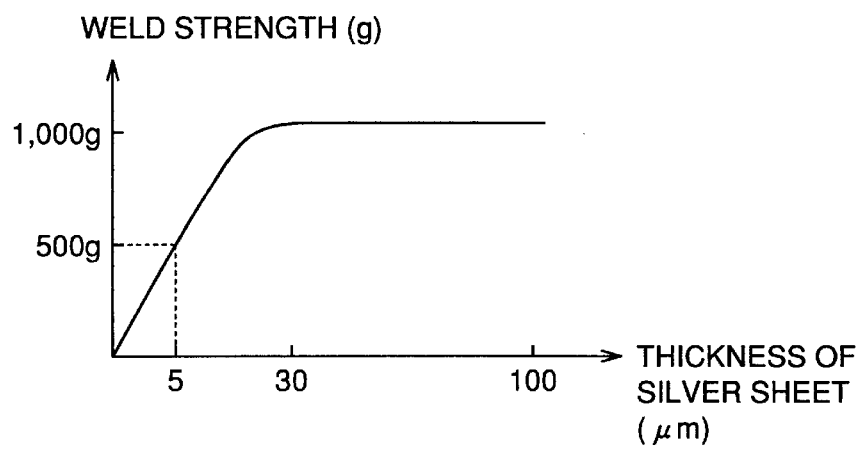

A silver sheet of 30 μm in thickness was employed in the present embodiment. It is appreciated that a weld strength of at least 500 g can be obtained if the thickness of the silver sheet is at least 5 μm as shown in FIG. 8B. If the thickness of the silver sheet is 100 μm or more, the cover glass, if attached to solar cell 6, is inclined to cause generation of an unattached portion between the cover glass and solar cell 6, whereby solar cell 6 or the cover glass was damaged in connecting solar cells 6 with each other in series or in parallel by welding. Therefore, a test for an interconnector of 100 μm or greater in thickness was not carried out.

Figure 8C:
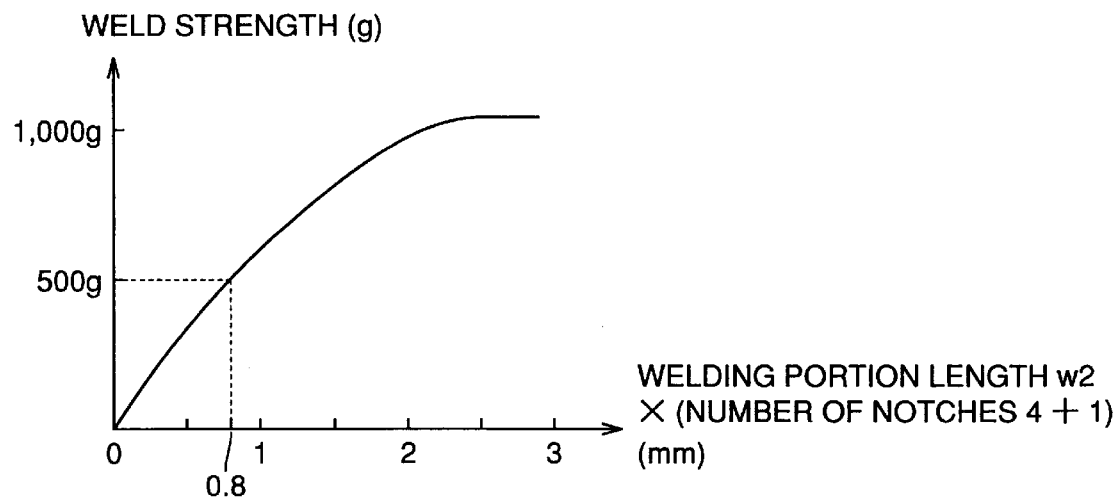

FIG. 8C shows the relationship between the total of the length of the weld portion and the weld strength when the weld strength was measured after welded interconnector 1 was subjected to a thermal shock test. The total length of the weld portion is the weld portion length w2×(number of notches 4+1). When the weld portion total length (weld portion length w2×(number of notches 4+1)) is at least 0.8 mm, a weld strength of 500 g is obtained as shown in FIG. 8C. Here, the number of notch 4 is 1. More specifically, sufficient strength can be obtained if interconnector 1 has at least one notch, and the length of the weld portion is at least 0.8 mm.

According to the interconnector of the present embodiment, a weld strength of a sufficient level can be obtained by setting the length and the number of notches 4 appropriately.

Fourth Embodiment

Figure 9:
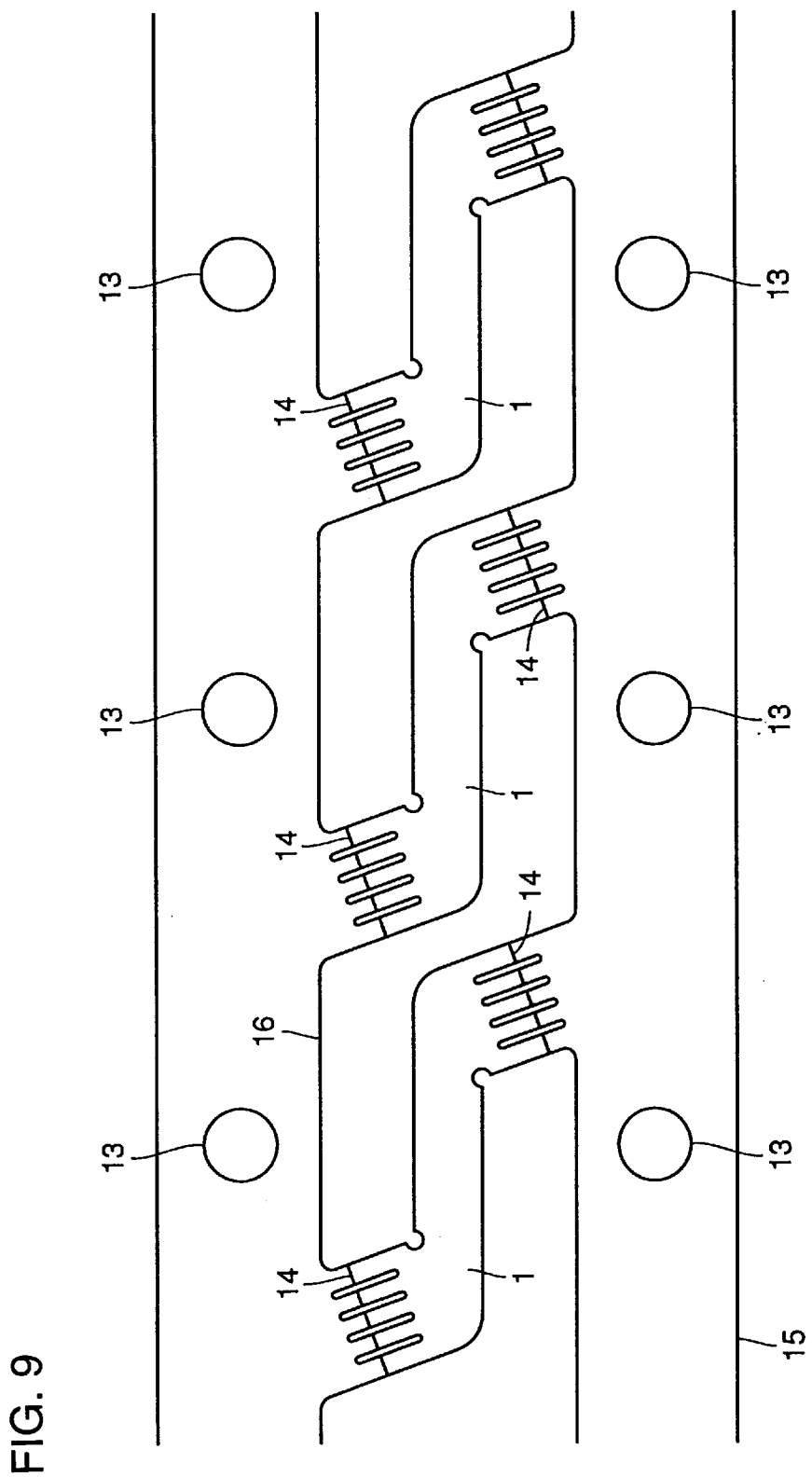
FIG. 9 shows the formation of an interconnector group 15 at a continuous sheet-like material.

FIG. 9 shows an example of an interconnector according to a fourth embodiment of the present invention. FIG. 9 corresponds to interconnector 1 of the first embodiment shown in FIG. 2, formed at a continuous sheet-like material. Interconnector 1 of the present invention is formed repeatedly at a continuous sheet-like material by press working. By severing two cut away sections 14, one interconnector 1 can be extracted.

When a mesh opening or permeable hole is to be provided in the connecting portion of the interconnector, a connector must be fabricated one by one since it is necessary to form the mesh opening or permeable hole by etching. In contrast to the conventional interconnector that does not allow continuity to negate reduction in cost, interconnector group 15 of the present embodiment can be formed by press working. Therefore, the cost can be lowered.

Figures 10A, 10B, 10C, 10D:
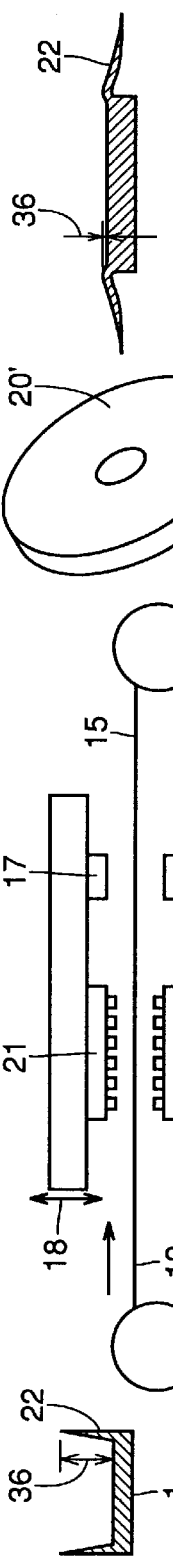
FIG. 10A is a diagram to describe a broad projection formed at interconnector 1.
FIG. 10B shows a schematic structure of an apparatus to remove the broad projection.
FIG. 10C is a diagram to describe a reel in which a continuous sheet-like material where interconnector group 15 is formed is accommodated.
FIG. 10D is a sectional view of interconnector 1 when the broad projection is bent laterally.

Interconnector group 15 of the present embodiment having a length of at least 10 m can be fabricated easily. Interconnector group 15 can be accommodated wound in a reel 20' as shown in FIG. 10C. Several ten thousand interconnectors 1 are accommodated in reel 20'. Therefore, the space for storage can be reduced than the conventional case where interconnectors are accommodated in a pallet. The number of interconnectors 1 can be identified by identifying the length of interconnector group 15. Therefore, administration of interconnectors 1 is extremely simple.

A pilot hole 13 (refer FIG. 9) for positioning is provided with respect to interconnector group 15. The position of forming interconnector group 15 is determined according to pilot holes 13. Therefore, automation of the weld task is possible as will be described afterwards. Description of forming interconnector 1 of FIG. 1 continuously has been provided. However, the present embodiment is applicable to interconnectors 1a–1e shown in FIGS. 4A–4E. Furthermore, formation of interconnector group 15 is not limited to press working, and etching or the like may be employed instead.

According to the interconnector of the present embodiment, the cost can be reduced since interconnector group 15 is formed by press working.

Fifth Embodiment

FIG. 10A is a diagram to describe a broad projection (burr) generated in forming interconnector group 15 of FIG. 9 by press working. FIG. 10A shows a cross section of the formed interconnector 1. When interconnector group 15 is formed by press working, a broad projection 22 is generated between interconnector 1 and drop portion 16. If interconnector 1 is connected to a solar cell with broad projection 22 still formed, a scratch or crack may be generated in the cover glass that covers the solar cell or in the base plate that secures the solar cell when the solar cell is deformed by heat. It was therefore necessary to distinguish the front surface from the back surface of interconnector 1 to prevent any scratches or cracks as much as possible.

FIG. 10 is a diagram to describe an apparatus removing broad projection 22 of interconnector 1 according to the fifth embodiment of the present invention. This apparatus includes a reel 20 in which continuous sheet-like material 19 is stored, a press work die 21 forming interconnector group 15 at a continuous sheet-like material 19, a flat punch 17 to crush projection 22, and a reel 20' accommodating the formed interconnector group 15.

By the move of press work die 21 and punch 17 in the direction of arrow 18, interconnector 1 is formed at sheet-like material 19 on press work die 21, and also broad projection 22 generated around interconnector 1 is crushed in the die by punch 17 located downstream.

When the thickness of the sheet is small, projection 22 generated at the cross section of interconnector 1 shown in FIG. 10A has a length of approximately 10–50% the sheet thickness depending upon the material. For example, when the material is silver and the thickness is 30 $\mu$m, the height 36 of broad projection 22 is approximately 15 $\mu$m when press working is carried out.

It is known that projection 22 generally becomes harder than the hardness of the parent material by work-hardening. Solar cells used for artificial satellites are susceptible to severe temperature environment under the usage status. It is required that such solar cells can withstand the thermal cycle condition of several thousand to several ten thousand cycles at −140° C.~+100° C. Since the interconnector expands/contracts under such a severe environment, there is a possibility that the substrate or the cover glass of the solar cell is damaged by broad projection 22 to result in breakage of the panel per se, in the worst case. It is therefore, necessary to remove or bend laterally this broad projection 22.

As mentioned above, the length of projection 22 that is generated becomes approximately 15 $\mu$m when the sheet thickness is 30 $\mu$m. High accuracy is required for the vertical-motion press machine and the bottom dead center of the die in the case where projection 22 is to be crushed by press working. In the conventional press machine, a bottom dead center accuracy of only ±10 $\mu$m could be achieved. However, it has become possible to achieve a bottom dead center accuracy of ±1–2 $\mu$m in accordance with improvement of the press technique. Using a press machine having a bottom dead center accuracy of ±1 $\mu$m in the present embodiment, projection 22 can be bent laterally as shown in the cross sectional view of FIG. 10D to suppress the height 36 of projection 22 to be not more than 1 $\mu$m. As a result of carrying out a thermal shock test under the above-described embodiment using an interconnector formed according to the present embodiment, it was confirmed that the cover glass or substrate were not broken or damaged.

By removing broad projection 22 and eliminating the difference between the front side and the back side of interconnector 1, fabrication of a solar cell panel is facilitated and reliability thereof is improved. More specifically, removal of broad projection 22 in interconnector 1 prevents generation of scratches and cracks in the cover glass covering the solar cell panel or in the base plate securing the solar cells when the solar cell panel is deformed by heat. Thus, reliability of the solar cell panel is improved.

As shown in FIG. 10C, the formed interconnector group 15 is accommodated and stored in reel 20'. Reel 20' in which interconnector group 15 is accommodated is used in the fabrication of a solar cell panel as will be described afterwards.

According to the apparatus of the present embodiment, broad projection 22 of interconnector 1 is removed. Therefore, generation of scratches and cracks in the cover glass covering the solar cell panel and the base plate fixing the solar cells during deformation of the solar cell panel caused by heat can be prevented.

Sixth Embodiment

Figure 11:
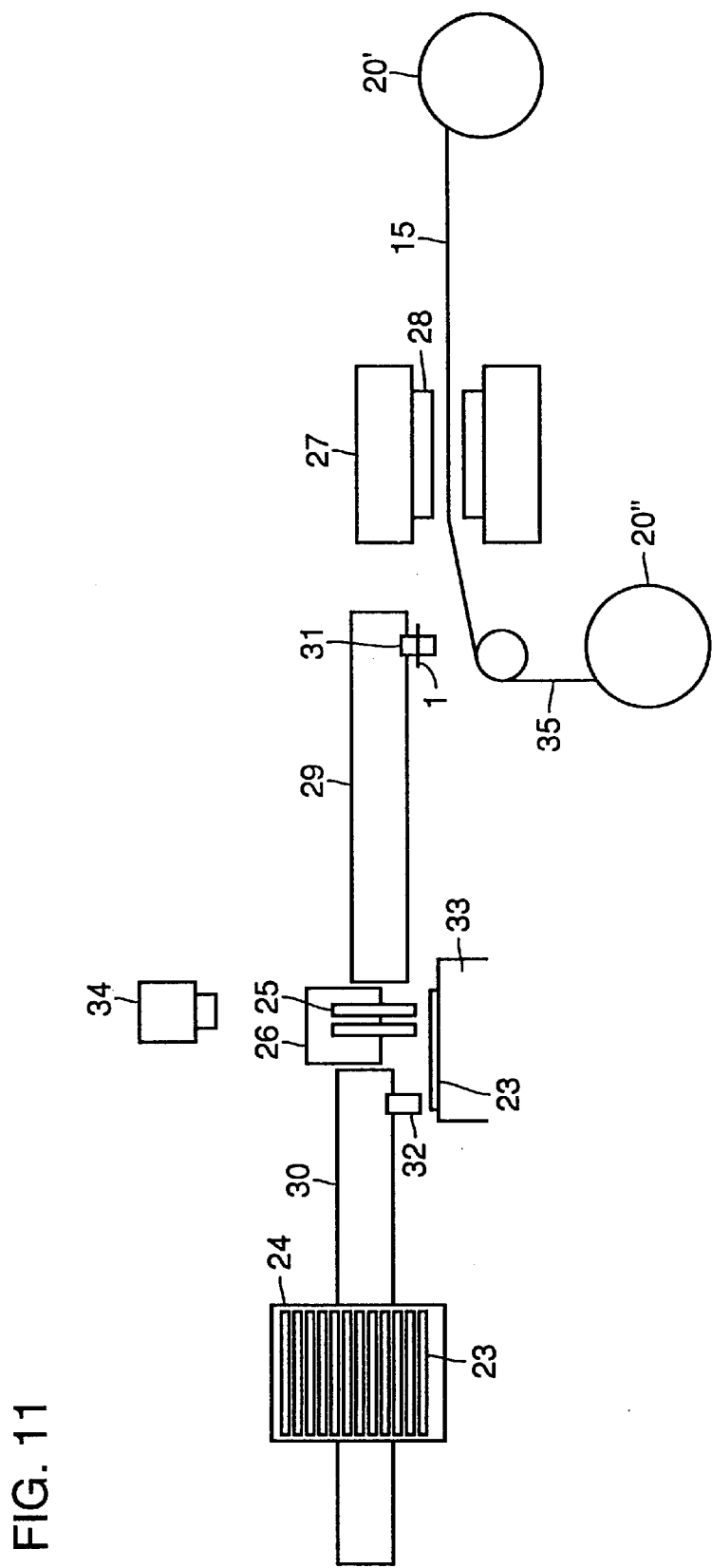
FIG. 11 shows the schematic structure of a join apparatus according to a sixth embodiment.

FIG. 11 is the diagram to describe a schematic structure of a join apparatus of a solar cell panel according to a sixth embodiment of the present invention. This join apparatus includes a sever device 27 severing interconnector group 15 accommodated in reel 20' to cut off interconnector 1, a reel 20" winding and collecting sheet-like material 35 after interconnector 1 is cut off therefrom, a convey stage 29 conveying the cut off interconnector 1, a welding machine 26 welding interconnector 1 to a solar cell 23, a welding stage 33 on which solar cell 23 and interconnector 1 are mounted when welded by welding machine 26, a cell cassette 24 in which solar cells 23 are accommodated, a cell convey device 30 conveying solar cells 23, and a positioning camera 34 installed above welding stage 33.

Sever device 27 is provided with a sever unit 28 formed of a die end, an edged tool and the like to cut off interconnector 1 by severing two regions of interconnector group 15 shown in FIG. 9 with sever unit 14. At convey stage 29, interconnector 1 that is cut off is held by a convey hand 31 provided below to be conveyed on welding stage 33. In cell convey device 30, solar cell 23 accommodated in cell cassette 24 is held by a cell convey hand 32 to be transported on welding stage 33.

Positioning camera 34 shoots the region above welding stage 33, whereby convey hand 31 and cell convey hand 32 are controlled so that connecting portion 3 of interconnector 1 and the connecting portion of solar cell 23 are placed at a predetermined position. Following the positioning between interconnector 1 and solar cell 23, welding machine 26 controls a weld electrode 25 to apply welding as shown in FIG. 3 or 5. Interconnector 1 and solar cell 23 subjected to welding are transported by cell convey device 30 again to be stored in cell cassette 24. Since positioning is effected by pilot hole 13 in the generation of interconnector group 15, it is not necessary to carry out positioning again on welding stage 23 after interconnector 1 severed by sever device 27 is conveyed by convey stage 29.

According to the join apparatus of the present embodiment, interconnector 1 is severed from interconnector group 15 stored in reel 20' and then welded to solar cell 23. It is therefore possible to automate the welding process between interconnector 1 and solar cell 23. A join apparatus can be realized by a simple structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnector comprising:
   a first connecting portion connected to an electrode of a first electronic device element,
   a second connecting portion connected to an electrode of a second electronic device element adjacent to said first electronic device element, and
   a stress relief portion absorbing displacement generated between said first electronic device element and said second electronic device element,
   wherein at least one of said first connecting portion and said second connecting portion has a plurality of notches provided therein, wherein respective depths of said notches gradually increase across the at least one connecting portion.

2. The interconnector according to claim 1, wherein said notches are provided so that a width of each of the notches is not more than a width of a joining portion excluding the notches.

3. The interconnector according to claim 1, wherein said electrode of said first electronic device element is a front surface electrode, and
   said electrode of said second electronic device element is a back electrode.

4. The interconnector according to claim 1, wherein said interconnector is of a material of silver, and has a thickness of 5–100 μm.

5. The interconnector according to claim 1, wherein each of said notches has a length greater than a width of a weld electrode used in welding said interconnector.

6. The interconnector according to claim 1, wherein said notches are provided so that a total width of a joining portion excluding the notches is at least 0.8 mm.

7. An interconnector comprising:
   a first connecting portion connected to an electrode of a first electronic device element,
   a second connecting portion connected to an electrode of a second electronic device element adjacent to said first electronic device element,
   a stress relief portion absorbing displacement generated between said first electronic device element and said second electronic device element, and
   wherein at least one of said first connecting portion and said second connecting portion has at least one notch formed at an oblique angle with respect to said at least one of the first connecting portion and the second connection portion.

8. The interconnector according to claim 7, wherein said notch is provided so that a width of the notch is not more than a width of a joining portion excluding the notch.

9. The interconnector according to claim 7, wherein said electrode of said first electronic device element is a front surface electrode, and
   said electrode of said second electronic device element is a back electrode.

10. The interconnector according to claim 7, wherein said interconnector is of a material of silver, and has a thickness of 5–100 μm.

11. The interconnector according to claim 7, wherein said notch has a length greater than a width of a weld electrode used in welding said interconnector.

12. The interconnector according to claim 7, wherein said notch is provided so that a total width of a joining portion excluding the notch is at least 0.8 mm.

13. An interconnector comprising:
   a first connecting portion connected to an electrode of a first electronic device element,
   a second connecting portion connected to an electrode of a second electronic device element adjacent to said first electronic device element,
   a stress relief portion absorbing displacement generated between said first electronic device element and said second electronic device element, and
   wherein at least one of said first connecting portion and said second connecting portion has at least one notch formed in a lateral direction of said at least one of the first connecting portion and the second connecting portion, so that said at least one notch is perpendicular to an end of said at least one connecting portion.

14. The interconnector according to claim 13, wherein said notch is provided so that a width of the notch is not more than a width of a joining portion excluding the notch.

15. The interconnector according to claim 13, wherein said electrode of said first electronic device element is a front surface electrode, and
   said electrode of said second electronic device element is a back electrode.

16. The interconnector according to claim 13, wherein said interconnector is of a material of silver, and has a thickness of 5–100 μm.

17. The interconnector according to claim 13, wherein said notch has a length greater than a width of a weld electrode used in welding said interconnector.

18. The interconnector according to claim 13, wherein said notch is provided so that a total width of a joining portion excluding the notch is at least 0.8 mm.

19. An interconnector comprising:
   a first connecting portion connected to an electrode of a first electronic device element,
   a second connecting portion connected to an electrode of a second electronic device element adjacent to said first electronic device element,
   a stress relief portion absorbing displacement generated between said first electronic device element and said second electronic device element, and
   wherein at least one of said first connecting portion and said second connecting portion has at least one notch formed in a zigzag manner.

20. The interconnector according to claim 19, wherein said notch is provided so that a width of the notch is not more than a width of a joining portion excluding the notch.

21. The interconnector according to claim 19, wherein said electrode of said first electronic device element is a front surface electrode, and said electrode of said second electronic device element is a back electrode.

22. The interconnector according to claim 19, wherein said interconnector is of a material of silver, and has a thickness of 5–100 $\mu$m.

23. The interconnector according to claim 19, wherein said notch has a length greater than a width of a weld electrode used in welding said interconnector.

24. The interconnector according to claim 19, wherein said notch is provided so that a total width of a joining portion excluding the notch is at least 0.8 mm.

25. An interconnector comprising:

a first connecting portion connected to an electrode of a first electronic device element, a second connecting portion connected to an electrode of a second electronic device element adjacent to said first electronic device element, two stress relief portions absorbing displacement generated between said first electronic device element and said second electronic device element, and wherein at least one of said first connecting portion and said second connecting portion has at least one notch.

26. The interconnector according to claim 25, wherein said notch is provided so that a width of the notch is not more than a width of a joining portion excluding the notch.

27. The interconnector according to claim 25, wherein said electrode of said first electronic device element is a front surface electrode, and said electrode of said second electrode device element is a back electrode.

28. The interconnector according to claim 25, wherein said interconnector is of a material of silver, and has a thickness of 5–100 $\mu$m.

29. The interconnector according to claim 25, wherein said notch has a length greater than a width of a weld electrode used in welding said interconnector.

30. The interconnector according to claim 25, wherein said notch is provided so that a total width of a joining portion excluding the notch is at least 0.8 mm.

* * * * *

UNITED STATES PATENT AND TRADEMARK OFFICE
CERTIFICATE OF CORRECTION

PATENT NO.    : 6,315,575 B1  
DATED         : November 13, 2001  
INVENTOR(S)   : Kajimoto It is certified that error appears in the above-identified patent and that said Letters Patent is hereby corrected as shown below:

<u>Title page,</u>
Item [54], title should read: -- INTERCONNECTOR ELECTRICALLY CONNECTING A PLURALITY OF ELECTRONIC DEVICE ELEMENTS. --

[30] Foreign Application Priority Data  Second priority claim should be:

-- Feb. 8, 2000  (JP)    2000-030065 --

Signed and Sealed this

Ninth Day of July, 2002

*Attest:*

*Attesting Officer*

JAMES E. ROGAN
*Director of the United States Patent and Trademark Office*